United States Patent [19]
Kubota et al.

[11] Patent Number: 6,156,237
[45] Date of Patent: Dec. 5, 2000

[54] CONDUCTIVE PASTE AND CIRCUIT SUBSTRATE FORMED BY USE OF THE PASTE

[75] Inventors: Masahiro Kubota, Shiga-ken; Michiaki Iha, Kusatsu; Shizuharu Watanabe, Omihachiman, all of Japan

[73] Assignee: Murata Manufacturing Co., Ltd., Japan

[21] Appl. No.: 09/487,437

[22] Filed: Jan. 19, 2000

[30] Foreign Application Priority Data

Mar. 25, 1999 [JP] Japan ................................ 11-081542

[51] Int. Cl.⁷ ........................................................ H01B 1/22
[52] U.S. Cl. ............................ 252/512; 252/513; 252/514
[58] Field of Search ............................ 252/512, 513, 252/514

[56] References Cited

U.S. PATENT DOCUMENTS 5,914,358   6/1999   Kawakita et al. .................... 523/458

FOREIGN PATENT DOCUMENTS

| 05287221 | 11/1993 | Japan . |
| 06224538 | 8/1994 | Japan . |
| 08227153 | 9/1996 | Japan . |
| 08335757 | 12/1996 | Japan . |
| 09218508 | 8/1997 | Japan . |
| 09218509 | 8/1997 | Japan . |
| 09222723 | 8/1997 | Japan . |
| 10171107 | 6/1998 | Japan . |

*Primary Examiner*—Mark Kopec
*Attorney, Agent, or Firm*—Ostrolenk, Faber, Gerb & Soffen, LLP

[57] ABSTRACT

A conductive paste including an organic binder having an acidic functional group; an inorganic powder containing glass and/or ceramic; a conductive metallic powder; and a mono-ol compound having a boiling point of about 178° C. or higher. At least one of the inorganic powder and the conductive metallic powder contains a multivalent metal. The paste is useful in the formation of a fine and minute thick-film conductive pattern having strong adhesion to a substrate.

17 Claims, No Drawings

CONDUCTIVE PASTE AND CIRCUIT SUBSTRATE FORMED BY USE OF THE PASTE

BACKGROUND OF THE INVENTION

1. Field of the Invention

The present invention relates to a conductive paste used for forming a desired conductive pattern on a substrate, and to a circuit substrate formed by use of the paste.

2. Background Art

Recently, strongly demanded are high-frequency electronic components used in mobile communication devices, satellite broadcasting receiving devices, computers having small size and high performance. Concurrently, wiring patterns of high-frequency electronic components are required to have increased density and signal speed. In order to increase density and signal speed in the wiring pattern, the pattern must be made finer and yet form a thicker film.

A conventional method for forming a wiring pattern of a high-frequency electronic component is firstly a wiring pattern is formed on an insulating substrate by use of a conductive paste comprising a conductive metallic powder of a multivalent metal such as iron or copper and an organic vehicle containing an organic binder and an organic solvent. Subsequently, the resultant pattern is dried and fired. In the method, a wiring pattern is generally formed through screen printing, and the lower limit of the width and pitch of the thus-formed wiring pattern is approximately 50 μm.

Japanese Patent Application Laid-Open (kokai) Nos. 287221/1993 and 227153/1996 disclose a method for forming a fine thick-film wiring pattern through photolithography by use of a photosensitive conductive paste. According to the method, a photosensitive conductive paste is applied onto an insulating substrate and the paste is dried and subjected to patterning by means of photolithography. The paste contains a conductive metallic powder, an acrylic copolymer having one or more carboxyl groups and one or more ethylenic unsaturated groups in the side chains, a photoreactive compound and a photopolymerization initiator.

Meanwhile, Japanese Patent Application Laid-Open (kokai) Nos. 224538/1994 and 335757/1996 disclose a method for forming a fine thick-film wiring pattern through photolithography by use of a photosensitive conductive paste containing a glass powder. According to the method, adhesion between the conductive pattern and a ceramic substrate is enhanced by incorporating a glass powder into a photosensitive conductive paste.

Recently, in consideration of the environment, it has been demanded that development be carried out by use of water or an aqueous alkali solution in photolithography making use of a photosensitive conductive paste. Therefore, the organic binder contains an acidic functional group such as a carboxyl group, which group has a property to release a proton.

However, in the case of employment of such an organic binder, ions of a multivalent metal, which ions are released into solution, may react with anions of the organic binder, which anions are formed after protons are released, and a three-dimensional network structure may be formed by ionic cross-linking to thereby form a gel. When the photosensitive conductive paste becomes a gel, application of the paste becomes difficult. Even if application of the paste can be carried out, development of the paste may be unstable, making employment of the paste difficult. In order to prevent gelation of a photosensitive conductive paste, Japanese Patent Application Laid-Open (kokai) No. 218509/1997 discloses a method in which a phosphorous-containing compound such as phosphoric acid, serving as a gelation-suppressing agent, is incorporated into the paste; Japanese Patent Application Laid-Open (kokai) No. 218508/1997 discloses a method in which a compound having an azole structure such as benzotriazole, serving as a gelation-suppressing agent, is incorporated into the paste; and Japanese Patent Application Laid-Open (kokai) No. 222723/1997 discloses a method in which an organic compound having a carboxyl group, such as acetic acid, serving as a gelation-suppressing agent, is incorporated in the paste. However, these methods enable only slight retardation of gelation of the paste and even when the paste contains the gelation-suppressing agent, use of the paste is difficult in practice.

In addition, Japanese Patent Application Laid-Open (kokai) No. 171107/1998 discloses a method in which 3-methyl-3-methoxybutanol serving as an organic solvent is incorporated into the paste in order to prevent gelation of the photosensitive paste. However, 3-methyl-3-methoxybutanol has a low boiling point of 174° C. and thus, when the paste is dried after application, the organic solvent component completely vaporizes and the effect of preventing gelation may not be exhibited. Thus, a phenomenon similar to gelation may occur in the dried paste, i.e., a three-dimensional network structure may be formed by ionic cross-linking, and the molecular weight of the paste may become substantially high. As a result, problems may occur. For example, unexposed portions of the paste may fail to dissolve into a developer.

SUMMARY OF THE INVENTION

To overcome the above-described problems, preferred embodiments of the present invention provide a conductive paste and a circuit substrate formed by use of the paste, which paste has strong adhesion to a substrate, can be formed into a fine thick-film conductive pattern, hard gels and has excellent storage stability.

The present inventors have conducted extensive studies and have found that gelation of a conductive paste can be effectively suppressed by incorporating a mono-ol compound having a boiling point of about 178° C. or higher into a system in which anions of an organic binder having an acidic functional group and ions of a multivalent metal may be released in a solution.

One preferred embodiment of the present invention provides a conductive paste comprising an organic binder having an acidic functional group, an inorganic powder containing glass and/or ceramic, and a conductive metallic powder, at least one of the inorganic powder and the conductive metallic powder containing a multivalent metal, wherein the paste contains a mono-ol compound having a boiling point of about 178° C. or higher.

Preferably, the conductive metallic powder comprises at least one conductive metal species selected from the group consisting of gold, silver, copper, platinum, aluminum, palladium, nickel, molybdenum and tungsten.

Preferably, the volume fraction of the inorganic powder and the volume fraction of the conductive metallic powder are both not less than about 30% and less than about 90%.

Preferably, the conductive paste further contains a photosensitive organic component.

Preferably, the conductive metallic powder has a mean particle size of about 0.1 μm or more and less than about 10 μm.

Preferably, the inorganic powder has a mean particle size of about 0.1 µm or more and less than about 10 µm.

Preferably, the conductive paste further contains a UV-absorbing agent.

Preferably, the organic binder is an acrylic copolymer having a carboxylic side chain. As used herein, a "carboxylic side chain" refers to a side chain which contains one or more carboxylic groups.

Preferably, the mono-ol compound is contained in a molar amount of at least twice that of ions of the multivalent metal released in a solution portion of the paste.

Preferably, an organic solvent is further present and the amount of the mono-ol compound is and about 10–92 wt. % based on the total amount of the mono-ol compound and the organic solvent.

The present invention also provides a circuit substrate produced by forming on a substrate a desired pattern by use of a conductive paste as described above and firing the thus-formed paste.

The conductive paste described above contains an organic binder having an acidic functional group, an inorganic powder containing glass and/or ceramic, a conductive metallic powder, and a mono-ol compound having a boiling point of about 178° C. or higher, and thus gelation of the paste can be suppressed sufficiently while the paste is in its original state before application and while the paste is in a film state after application and drying. In addition, a fine thick-film conductive pattern having strong adhesion to a substrate can be formed.

When the conductive paste of the present invention further contains a photosensitive organic component, gelation of the paste can be sufficiently suppressed while the paste is in its original state before application and while the paste is in a film state after application and drying. In addition, the paste can be consistently developed through photolithography and a very fine thick-film conductive pattern can be formed at high accuracy.

The circuit substrate of the present invention has a desired pattern which is formed on an insulating substrate by use of the conductive paste and fired, and therefore a fine thick-film conductive pattern having strong adhesion to the substrate can be formed. As a result, the circuit substrate having sufficiently increased wiring density and signal speed can be produced.

The reasons why gelation of the paste can be suppressed are described below. The hydroxyl group (—OH) in a monohydroxy alcohol compound has very high ability to bind to a multivalent metallic ion, as compared with an acidic functional group of an organic binder (particularly a carboxylic group). Therefore, the reaction between the mono-ol compound and the multivalent metallic ion precedes the reaction between the organic binder and the ion, and ionic cross-linking between the organic binder and the multivalent metallic ion and formation of a three-dimensional network structure are hindered. Since the mono-ol compound has only one hydroxyl group, no three-dimensional network structure is formed by ionic cross-linking when the mono-ol compound bonds to the multivalent metallic ion. In addition, the mono-ol compound has a boiling point of about 178° C. or higher and thus, even after the paste is applied and dried, the mono-ol compound significantly remains in the film and exhibits sufficient ability to prevent gelation.

DESCRIPTION OF THE PREFERRED EMBODIMENTS

The conductive paste of the present invention will next be described in more detail.

In the conductive paste of the present invention, examples of the mono-ol compounds having a boiling point of about 178° C. or more include 1-octyl alcohol, 2-octyl alcohol, nonyl alcohol, decyl alcohol, 1-methylcyclohexanol, trimethylcyclohexanol, ethylene glycol monoacetate, diethylene glycol monobutyl ether, diethylene glycol monoethyl ether, diethylene glycol monohexyl ether, diethylene glycol monomethyl ether, diethylene glycol monomethyl ether, diethylene glycol monovinyl ether, dipropylene glycol monomethyl ether, dipropylene glycol monoethyl ether, dipropylene glycol monobutyl ether, ethylene glycol monoisoamyl ether, ethylene glycol monophenylether, ethylene glycol monobenzyl ether, trimethylhexanol, tetrahydrofurfuryl alcohol, cresol, butyl lactate, benzyl alcohol, hydroxyethyl acrylate, phenethyl alcohol, mercaptobutanol, hydroxyethyl methacrylate, hydroxyethylpiperazine, cyclohexanone oxime, hydroxymethoxyallylbenzene, hydroxymethoxybenzaldehyde, hydroxymethylpiperazine, hydroxypropionitrile, hydroxyacetonaphthone, hydroxybenzaldehyde, hydroxyacetophenone, hydroxybenzimidazole, phenylphenol, hydroxybenzoic acid, hydroxybenzophenone, benzoin, thymol, hydroxymethoxybenzoic acid, hydroxymethylbenzoic acid, hydroxymethylpyrone, hydroxynaphthoic acid, hydroxynaphthoquinone, hydroxynorbornenedicarboxyimide, hydroxyphenylacetic acid, hydroxyphenylglycine, hydroxyphthalimide, hydroxypivalic acid neopentyl glycol ester, hydroxypropiophenone, hydroxystearic acid, hydroxysuccinic acid imide and hydroxytoluic acid.

In the conductive paste of the present invention, the inorganic powder is a glass powder and/or a ceramic powder. The glass powder may be any known glass powder such as a borosilicate glass powder and the ceramic powder may be any known ceramic powder such as a glass-ceramic powder, a glass-composite powder or a non-glass powder.

Particularly, the aforementioned glass powder may contain the oxide of a multivalent metal having a valence of two or more, such as $SiO_2$—PbO, $SiO_2$—ZnO, $SiO_2$—$Bi_2O_3$, $SiO_2$—$K_2O$, $SiO_2$—$Na_2O$, $SiO_2$—PbO—$B_2O_3$, $SiO_2$—ZnO—$B_2O_3$, $SiO_2$—$Bi_2O_3$—$B_2O_3$, $SiO_2$—$K_2O$—$B_2O_3$ or $SiO_2$—$Na_2O$—$B_2O_3$. The aforementioned ceramic powder may be a ceramic powder containing a compound of a multivalent metal having a valence of two or more. Examples of the compound include oxides, borides, nitrides, and suicides of at least one multivalent metal selected from the group consisting of Al, Ba, Ti, Sr, Pb, Zr, Mn, Co, Ni, Fe, Y, Nb, La and Ru.

In the conductive paste of the present invention, the aforementioned conductive metallic powder may be at least one species selected from the group consisting of gold, silver, copper, platinum, aluminum, palladium, nickel, molybdenum and tungsten. Particularly when certain multivalent metals, i.e., copper, aluminum, palladium, nickel, molybdenum, tungsten or a mixture thereof, is used, ionic cross-linking between ions of the multivalent metal and anions of an organic binder and formation of a three-dimensional network structure can be effectively suppressed.

Accordingly, ionic cross-linking between ions of the multivalent metal released in solution and anions of an organic binder having an acidic functional group such as a carboxylic group and formation of a three-dimensional network structure can be suppressed in the conductive paste of the present invention, to thereby effectively suppress gelation of the paste in the following cases: where the conductive metallic powder contains a metallic powder of a multivalent metal having a valence two or more; where a metallic compound (metal oxide) in the aforementioned inorganic powder containing glass and/or ceramic is a metallic compound containing a multivalent metal having a valence two or more; and a combination of these cases.

In the conductive paste of the present invention, the volume fraction of the aforementioned inorganic powder and conductive metallic powder is preferably about 30–90% since sinterability of the paste can be enhanced. When the volume fraction is less than about 30%, drastic volume constriction may occur during firing, and, for example, pattern breakage may occur when a pattern is formed. In contrast, when the volume fraction is in excess of about 90%, the strength of a formed structure becomes very low and thus the structure may break during firing. As used herein, the volume fraction of the aforementioned inorganic powder refers to the volume fraction of the remaining inorganic powder after firing based on the paste.

The conductive paste of the present invention preferably contains a photosensitive organic component. The photosensitive organic component is incorporated into the paste to thereby form a photosensitive conductive paste.

The photosensitive conductive paste of the present invention contains the mono-ol compound having a boiling point of about 178° C. or higher, and therefore gelation of the paste can be sufficiently suppressed while the paste is in its original state before application and while the paste is in a film state after application and drying, and stability of the paste is enhanced. In addition, the paste can be consistently developed through photolithography and a fine thick-film conductive pattern having strong adhesion to a substrate can be formed.

The aforementioned photosensitive organic component may be conventionally known photopolymerizable compounds or photochangeable compounds. Examples of such compounds include:

(1) mixtures of a monomer or oligomer having a reactive functional group such as an unsaturated group and a photo-radical-initiator such as an aromatic carbonyl compound;

(2) diazo resins such as a condensate of an aromatic bisazide and formaldehyde;

(3) mixtures of an addition-polymerizable compound such as an epoxy compound and a photo-acid-generator such as a diaryliodonium salt; and (4) naphthoquinonediazide compounds.

Of these, mixtures of a monomer or oligomer having a reactive functional group such as an unsaturated group and a photo-radical-initiator such as an aromatic carbonyl compound are particularly preferred.

Examples of the aforementioned monomers or oligomers having a reactive functional group include hexanediol triacrylate, tripropylene glycol triacrylate, trimethylolpropane triacrylate, stearyl acrylate, tetrahydrofurfuryl acrylate, lauryl acrylate, 2-phenoxyethyl acrylate, isodecyl acrylate, isooctyl acrylate, tridecyl acrylate, caprolactone acrylate, ethoxylated nonylphenol acrylate, 1,3-butanediol diacrylate, 1,4-butanediol diacrylate, diethylene glycol diacrylate, tetraethylene glycol diacrylate, triethylene glycol diacrylate, ethoxylated bisphenol A diacrylate, propoxylated neopentyl glycol diacrylate, tris(2-hydroxyethyl) isocyanurate triacrylate, ethoxylated trimethylolpropane triacrylate, pentaerythritol triacrylate, propoxylated trimethylolpropane triacrylate, propoxylated glyceryl triacrylate, pentaerythritol tetraacrylate, ditrimethylolpropane tetraacrylate, dipentaerythritol hydroxypentaacrylate, ethoxylated pentaerythritol tetraacrylate, tetrahydrofurfuryl methacrylate, cyclohexyl methacrylate, isodecyl methacrylate, lauryl methacrylate, triethylene glycol dimethacrylate, ethylene glycol dimethacrylate, tetraethylene glycol dimethacrylate, 1,4-butanediol dimethacrylate, diethylene glycol dimethacrylate, 1,6-hexanediol dimethacrylate, neopentyl glycol dimethacrylate, 1,3-butylene glycol dimethacrylate, ethoxylated bisphenol A dimethacrylate and trimethylolpropane trimethacrylate.

Examples of the aforementioned photo-radical-generators include benzil, benzoin ethyl ether, benzoin isobutyl ether, benzoin isopropyl ether, benzophenone, benzoylbenzoic acid, methyl benzoylbenzoate, 4-benzoyl-4'-methyldiphenyl sulfide, benzyl dimethyl ketal, 2-n-butoxy-4-dimethylaminobenzoate, 2-chlorothioxanthone, 2,4-diethylthioxanthone, 2,4-diisopropylthioxanthone, isopropylthioxanthone, 2-dimethylaminoethylbenzoate, ethyl p-dimethylaminobenzoate, isoamyl p-dimethylaminobenzoate, 3,3'-dimethyl-4-methoxybenzophenone, 2,4-dimethylthioxanthone, 1-(4-dodecylphenyl)-2-hydroxy-2-methylpropan-1-one, 2,2-dimethoxy-1,2-diphenylethan-1-one, hydroxycyclohexyl phenyl ketone, 2-hydroxy-2-methyl-1-phenylpropan-1-one, 1-[4-(2-hydroxyethoxy)-phenyl]-2-hydroxy-2-methyl-1-propan-1-one, 2-methyl-1-[4-(methylthio)phenyl]-2-morpholinopropan-1-one, methylbenzoyl formate, 1-phenyl-1,2-propanedione-2-(o-ethoxycarbonyl) oxime, 2-benzyl-2-dimethylamino-1-(4-morpholinophenyl)-1-butanone, bis(2,6-dimethoxybenzoyl)-2,4,4-trimethylpentylphosphine oxide and bis(2,4,6-trimethylbenzoyl)phenylphosphine oxide.

In the photosensitive conductive paste of the present invention, the aforementioned conductive metallic powder preferably has a mean particle size ($D_{50}$) of about 0.1 $\mu$m or more and less than about 10 $\mu$m since the amount of light required for exposure can be reduced to the lower limit and development can be carried out effectively. When the mean particle size is less than about 0.1 $\mu$m, exposure sensitivity may decrease and the amount of light required for exposure tends to increase, whereas when the mean particle size is about 10 $\mu$m or more, resolution may deteriorate because of coarse particles during development. For the same reasons, the aforementioned inorganic powder preferably has a mean particle size ($D_{50}$) of about 0.1 $\mu$m or more and less than about 10 $\mu$m.

Preferably, the photosensitive conductive paste of the present invention further contains a UV-absorbing agent. By incorporation of a UV-absorbing agent into the paste, absorbability of exposure rays can be enhanced and exposure deterioration can be reduced to the lower limit. Typical UV-absorbing agents include azo-type red pigments and amine-type red pigments.

In the conductive paste of the present invention, the aforementioned organic binder is preferably an acrylic copolymer having a carboxylic side chain. Such an organic binder is also useful as a photosensitive organic binder and can be subjected to development by use of an alkali or aqueous developer with ease.

Particularly, when the aforementioned organic binder is an acrylic copolymer having a carboxylic side chain, ionic cross-linking between anions of the copolymer and multivalent metallic ions released in solution may occur, and a three-dimensional network structure tends to be formed. Therefore, by incorporating the aforementioned mono-ol compound into the paste, ionic cross-linking and formation of the three-dimensional network structure can be effectively suppressed.

The aforementioned organic binder containing an acrylic copolymer having a carboxylic side chain may be produced through copolymerization of an unsaturated carboxylic acid and an ethylenic unsaturated compound. Examples of unsaturated carboxylic acids include acrylic acid, methacrylic acid, maleic acid, fumaric acid, vinyl acetate and the anhydrides thereof. Examples of ethylenic unsaturated compounds include acrylate esters such as methyl acrylate and ethyl acrylate; methacrylate esters such as methyl methacrylate and ethyl methacrylate; and fumarate esters such as monoethyl fumarate. Alternatively, the aforementioned acrylic copolymer to which an unsaturated bond in the following forms has been introduced may also be:

(1) an acrylic copolymer obtained through addition of an acrylic monomer having a functional group, e.g., an epoxy group, reactive to a carboxyl group in a side chain of the aforementioned acrylic copolymer; and (2) an acrylic copolymer obtained through reaction of an unsaturated monocarboxylic acid with an acrylic copolymer having an epoxy group in a side chain instead of a carboxyl group and further introduction of a saturated or unsaturated multivalent carboxylic anhydride.

In the conductive paste of the present invention, the mono-ol compound is preferably contained in an amount (by mol) of at least twice that of ions of the multivalent metal released in solution portion of the paste. When the mono-ol compound is contained in an amount of less than twice, gelation of the paste is difficult to prevent sufficiently. The mol amount of the released ions of multivalent metal can be measured by means of conventionally known techniques such as atomic absorption spectrophotometry, ICP and ICP-MS, after the solid portion and the solution portion of the paste are separated from each other through centrifugation and filtration.

The conductive paste of the present invention contains an organic solvent, and the paste preferably contains the mono-ol compound in an amount of about 10–92 wt. % based on the total amount of the mono-ol compound and the organic solvent. When the amount of the mono-ol compound is about 10 wt. % or less, gelation of the paste is difficult to suppress sufficiently, whereas when the amount is about 92 wt. % or more, the viscosity of the paste decreases considerably and coatability of the paste may be deteriorated.

The conductive paste of the present invention may contain, if necessary, optional additives including a storage stabilizer such as a polymerization inhibitor; an anti-oxidant; a dye; a pigment; a defoaming agent; and a surfactant.

The circuit substrate of the present invention will next be described in more detail.

In the circuit substrate of the present invention, the conductive paste (particularly, a photosensitive conductive paste) of the present invention is applied to a substrate by means of screen printing or spin coating, and the paste is dried and subjected to exposure and development, to thereby form a fine pattern having, for example, a width and a pitch of 50 μm or less, which is difficult to form by means of conventional screen printing. In this case, specifically, the paste is dried at 40–100° C. for 10 minutes to two hours.

Meanwhile, the conductive paste of the present invention may be applied to a ceramic green sheet to thereby form a fine thick-film conductive pattern on the sheet, and the pattern may be subjected to a heat treatment such as firing to thereby produce a circuit substrate and a circuit element. In this case, the conductive paste of the present invention may be applied to a support such as a polyethylene terephthalate (PET) film to thereby form a fine pattern and the pattern may be thermally transferred onto a ceramic green sheet. Alternatively, the conductive paste of the present invention may be applied directly to a ceramic green sheet and a fine pattern may be formed by means of photolithography.

The aforementioned ceramic sheet may be a sheet formed of a mixed slurry of a ceramic powder and an organic vehicle, and the slurry may further contain a glass powder. In addition, the ceramic sheet may be a sheet having via holes formed through photolithography by use of a photosensitive green sheet formed of an organic vehicle containing a photosensitive organic component. Specifically, the aforementioned ceramic green sheet may be a ceramic green sheet containing insulating ceramic powders such as $Al_2O_3$, dielectric ceramic powders such as $BaTiO_3$, ferrite powders such as nickel zinc ferrite and nickel zinc copper ferrite, conductive ceramic powders such as $RuO_2$, $Pb_2Ru_2O_7$, $Bi_2Ru_2O_7$ and compound oxides of Mn.Co.Ni, and piezoelectric ceramic powders such as PZT.

A plurality of ceramic green sheets having fine patterns may be stacked and subjected to heat treatment such as simultaneous firing to thereby produce a multi-layer circuit substrate or a multi-layer circuit element. Alternatively, after a fine pattern is formed on a substrate or a support by use of the conductive paste of the present invention, a mixture containing a functional organic binder may be applied to the substrate or the support to thereby form a laminate, and the laminate may be subjected to heat treatment such as firing to thereby produce a multi-layer circuit substrate or a multi-layer circuit element. Examples of mixtures containing a functional organic binder include a mixture of the aforementioned ceramic powder and an organic binder, a mixture of a conductive metallic powder such as copper or silver and an organic binder, and such a mixture containing further a glass powder.

The circuit substrate of the present invention may be a substrate for a circuit element used in a chip capacitor or a chip LC filter, or a substrate for a module used in a voltage controlled oscillator (VCO) or a phase locked loop (PLL).

Particularly when the photosensitive conductive paste of the present invention is used, development of the paste can be carried out consistently by means of photolithography. Therefore, a fine thick-film conductive pattern required for an electronic circuit, such as a via hole or a pattern, can be formed and thus a small-sized circuit substrate or circuit element having excellent high-frequency characteristics can be produced. As a result, it is possible to attain a higher density or a higher signal speed of high-frequency chip electronic components such as a chip inductor and a chip laminated capacitor.

EXAMPLES

The present invention will next be described by way of examples.

Example 1

Materials having the following compositions were mixed in the following amounts, and the resultant mixture was kneaded by use of a three-roll mill to thereby prepare a photosensitive paste composition.

Organic binder

A copolymer of methacrylic acid and methyl methacrylate in which the weight ratio of methacrylic acid to methyl methacrylate is 25/75 (weight average molecular weight= 50,000): 2.0 g Inorganic powder
   SiO$_2$—PbO—B$_2$O$_3$ glass powder (boric acid content: 17 wt. %, mean particle size: 3 μm): 0.9 g
Conductive metallic powder
   Copper powder (mean particle size: 3 μm): 15.0 g
Reactive-functional-group-containing monomer
   Trimethylolpropane triacrylate: 1.0 g
Photopolymerization initiator
   2-Methyl-1-[4-(methylthio)phenyl]-2-morpholinopropan-1-one: 0.4 g
   2,4-diethylthioxanthone: 0.1 g
Organic solvent
   Ethylcarbitol acetate: 4.0 g
Mono-ol compound
   Dipropylene glycol monomethyl ether (boiling point: 189–190° C.): 1.0 g
UV-absorbing agent
   Azo-type red pigment: 0.1 g The thus-prepared photosensitive conductive paste was applied to an alumina insulating substrate by means of spin coating and dried at 100° C. for one hour to thereby form a film having a thickness of 20 μm. The thus-formed film was allowed to stand for 24 hours and then rays of a high pressure mercury lamp were applied to the film at an energy density of 250 mJ/cm$^2$ through a mask having a line/space (L/S) pattern=20/20 (μm). The resultant film was developed by use of an aqueous solution of sodium carbonate to thereby form a pattern of L/S=20/20 (μm). Thereafter, the film was subjected to degreasing treatment and fired in an N$_2$ atmosphere at 900° C. to thereby form a conductive pattern having L/S=10/30 (μm).

The photosensitive conductive paste prepared in Example 1 was stored in air at 20° C. for evaluation of storage stability. As a result, it was found that the paste did not gel immediately after preparation, nor did the paste gel one day, three days, one week and one month after preparation. After each of the periods described above, the paste was able to be applied to an insulating substrate by use of a spin coating apparatus, and a pattern could be formed by use of the paste through photolithography.

Example 2

The procedure of Example 1 was repeated, except that dipropylene glycol monomethyl ether was replaced by 2-octyl alcohol (boiling point: 178–179° C.) to thereby prepare a photosensitive conductive paste.

Example 3

The procedure of Example 1 was repeated, except that dipropylene glycol monomethyl ether was replaced by butyl lactate (boiling point: 185–187° C.) to thereby prepare a photosensitive conductive paste.

Example 4

The procedure of Example 1 was repeated, except that dipropylene glycol monomethyl ether was replaced by 3-methoxy-3-methylbutanol (boiling point: 173–175° C.) to thereby prepare a photosensitive conductive paste.

Example 5

The procedure of Example 1 was repeated, except that dipropylene glycol monomethyl ether was replaced by 4-methylcyclohexanol (boiling point: 172–175° C.) to thereby prepare a photosensitive conductive paste.

Example 6

The procedure of Example 1 was repeated, except that dipropylene glycol monomethyl ether was replaced by 1-heptyl alcohol (boiling point: 176° C.) to thereby prepare a photosensitive conductive paste.

In the same manner as in Example 1, patterns of L/S=20/20 (mm) were formed by use of the respective photosensitive conductive pastes prepared in Examples 2 to 6. The films formed of the respective photosensitive conductive pastes of Examples 1 to 6 were evaluated for stability during development. The results are shown in Table 1. In Table 1, rating "AA" refers to the case where unexposed portions of the paste dissolved into a developer and a pattern was formed desirably. In Table 1, rating "BB" refers to the case where unexposed portions of the paste partially dissolved into a developer and a pattern was formed insufficiently. In Table 1, rating "CC" refers to the case where unexposed portions of the paste failed to dissolve into a developer and a pattern failed to be formed.

TABLE 1

| Example No. | Mono–ol compound | Boiling point | Rating |
|---|---|---|---|
| 1 | Dipropylene glycol monomethyl ether | 189–190° C. | AA |
| 2 | 2–Octyl alcohol | 178–179° C. | AA |
| 3 | Butyl lactate | 185–187° C. | AA |
| 4 | 3-Methoxy-3-methyl-butanol | 173–175 ° C. | CC |
| 5 | 4–Methylcyclohexanol | 172–175° C. | CC |
| 6 | 1-Heptyl alcohol | 176° C. | BB |

Table 1 shows that in the cases of the photosensitive conductive pastes of Examples 1 to 3, which contain mono-ol compounds having a boiling point of about 178° C. or higher, unexposed portions of the paste dissolve into a developer with ease, and a well-shaped conductive pattern can be formed. In contrast, in the cases of Examples 4 to 6, when the photosensitive conductive paste contains a mono-ol compound having a boiling point of less than 178° C., unexposed portions of the paste dissolve into a developer insufficiently and a well-shaped conductive pattern fails to be formed. In such a case, the mono-ol compound may evaporate during drying treatment after application of the paste, and thus gelation-preventing ability may decrease with passage of time.

Example 7

The procedure of Example 1 was repeated, except that a mono-ol compound was not incorporated to thereby prepare a photosensitive conductive paste.

Example 8

The procedure of Example 1 was repeated, except that dipropylene glycol monomethyl ether (1.0 g) was replaced by phosphoric acid (0.1 g) to thereby prepare a photosensitive conductive paste.

Example 9

The procedure of Example 1 was repeated, except that dipropylene glycol monomethyl ether (1.0 g) was replaced by benzotriazole (0.02 g) to thereby prepare a photosensitive conductive paste.

Example 10

The procedure of Example 1 was repeated, except that dipropylene glycol monomethyl ether (1.0 g) was replaced by acetic acid (1.0 g) to thereby prepare a photosensitive conductive paste.

The respective photosensitive conductive pastes of Examples 7 to 10 were evaluated for storage stability. The pastes were stored in air at 20° C. The results are shown in Table 2 together with the evaluation results of the paste of Example 1. In Table 2, rating "AA" refers to the case where gelation of the paste did not occur and application of the paste was possible. In contrast, rating "BB" refers to the case where the paste gelled and application of the paste was impossible.

TABLE 2

| Example No. | Additive | Immediately after preparation | After one day | After three days | After one week | After one month |
| --- | --- | --- | --- | --- | --- | --- |
| 1 | Dipropylene glycol monomethyl ether | AA | AA | AA | AA | AA |
| 7 | None | AA | BB | BB | BB | BB |
| 8 | Phosphoric acid | AA | BB | BB | BB | BB |
| 9 | Benzotriazole | AA | BB | BB | BB | BB |
| 10 | Acetic acid | AA | BB | BB | BB | BB |

As is apparent from Table 2, the paste containing no mono-ol compound and the pastes containing gelation-preventing agents other than a mono-ol compound do not gel immediately after preparation and thus the pastes exhibit initial good stability. However, the pastes containing such agents gel with passage of time.

Example 11

Materials having the following compositions were mixed in the following amounts, and the resultant mixture was kneaded by use of a three-roll mill to thereby prepare a photosensitive paste composition.
Organic binder
  A copolymer of methacrylic acid and methyl methacrylate in which the weight ratio of methacrylic acid to methyl methacrylate is 25/75 (weight average molecular weight= 50,000): 2.0 g
Inorganic powder
  $SiO_2$—PbO—$B_2O_3$ glass powder (boric acid content: 17 wt. %, mean particle size: 3 $\mu$m): 0.9 g
Conductive metallic powder
  Silver powder (mean particle size: 3 $\mu$m): 10.0 g
Reactive-functional-group-containing monomer
  Trimethylolpropane triacrylate: 1.0 g
Photopolymernzation initiator
  2-Methyl-1-[4-(methylthio)phenyl]-2-morpholinopropan-1-one: 0.4 g
  2,4-diethylthioxanthone: 0.1 g
Organic solvent
  Ethylcarbitol acetate: 4.0 g
Mono-ol compound
  Dipropylene glycol monomethyl ether (boiling point: 189–190° C.): 1.0 g
UV-absorbing agent
  Azo-type red pigment: 0.1 g The thus-prepared photosensitive conductive paste was applied to an alumina insulating substrate by use of a spin coating apparatus and dried at 100° C. for one hour to thereby form a film formed of the paste having a thickness of 20 $\mu$m. The thus-formed film was allowed to stand for 24 hours, and subjected to exposure. Rays of a high pressure mercury lamp were applied to the film at an energy density of 250 mJ/cm$^2$ through a mask having a line/space (L/S) pattern=20/20 ($\mu$m). The resultant film was developed by use of an aqueous solution of sodium carbonate to thereby form a pattern of L/S=20/20 ($\mu$m). Thereafter, the film was fired in air at 850° C. to thereby form a conductive pattern having L/S=10/30 ($\mu$m).

The thus-formed conductive pattern was evaluated for adhesion strength against an insulating substrate and the results show that the adhesion strength was 2.0 kg/2 $\mu$m×2 $\mu$m at room temperature. The photosensitive conductive paste prepared in this Example 11 was also stored in air at 20° C. for evaluation of storage stability. As a result, it was found that the paste did not gel immediately after preparation, nor did the paste gel one day, three days, one week and one month after preparation. After each of the periods described above, the paste was able to be applied to an insulating substrate by use of a spin coating apparatus and a pattern could be formed by use of the paste through photolithography.

Example 12

The procedure of Example 11 was repeated, except that dipropylene glycol monomethyl ether was replaced by 2-octyl alcohol (boiling point: 178–179° C.) to thereby prepare a photosensitive conductive paste.

Example 13

The procedure of Example 11 was repeated, except that dipropylene glycol monomethyl ether was replaced by butyl lactate (boiling point: 185–187° C.) to thereby prepare a photosensitive conductive paste.

Example 14

The procedure of Example 11 was repeated, except that dipropylene glycol monomethyl ether was replaced by 3-methoxy-3-methylbutanol (boiling point: 173–175° C.) to thereby prepare a photosensitive conductive paste.

Example 15

The procedure of Example 11 was repeated, except that dipropylene glycol monomethyl ether was replaced by 4-methylcyclohexanol (boiling point: 172–175° C.) to thereby prepare a photosensitive conductive paste.

Example 16

The procedure of Example 11 was repeated, except that dipropylene glycol monomethyl ether was replaced by 1-heptyl alcohol (boiling point: 176° C.) to thereby prepare a photosensitive conductive paste.

In the same manner as in Example 1, patterns of L/S=20/ 20 ($\mu$m) were formed by use of the respective photosensitive conductive pastes prepared in Examples 12 to 16. The films formed of the respective photosensitive conductive pastes of Examples 11 to 16 were evaluated for stability during development. The results are shown in Table 3. In Table 3, rating "AA" refers to the case where unexposed portions of the paste dissolved into a developer and a pattern was formed desirably. In Table 3, rating "BB" refers to the case where unexposed portions of the paste partially dissolved into a developer and a pattern was formed insufficiently. In Table 3, rating "CC" refers to the case where unexposed portions of the paste failed to dissolve into a developer and a pattern failed to be formed.

TABLE 3

| Example | Mono-ol compound | Boiling point | Rating |
|---|---|---|---|
| 11 | Dipropylene glycol monomethyl ether | 189–190° C. | AA |
| 12 | 2-Octyl alcohol | 178–179° C. | AA |
| 13 | Butyl lactate | 185–187° C. | AA |
| 14 | 3-Methoxy-3-methyl-butanol | 173–175° C. | CC |
| 15 | 4-Methylcyclohexanol | 172–175° C. | CC |
| 16 | 1-Heptyl alcohol | 176° C. | BB |

Table 3 shows that in the cases of the photosensitive conductive pastes of Examples 11 to 13 which contain mono-ol compounds having a boiling point of about 178° C. or higher, unexposed portions of the paste dissolve into a developer with ease and a well-shaped conductive pattern can be formed. In contrast, in the cases of Examples 14 to 16, when the photosensitive conductive paste contains a mono-ol compound having a boiling point of lower than 178° C., the mono-ol compound evaporates during drying treatment after application of the paste, and thus gelation-preventing ability decreases with passage of time.

Example 17

The procedure of Example 11 was repeated, except that dipropylene glycol monomethyl ether was not incorporated to thereby prepare a photosensitive conductive paste.

Example 18

The procedure of Example 11 was repeated, except that dipropylene glycol monomethyl ether (1.0 g) was replaced by phosphoric acid (0.1 g) to thereby prepare a photosensitive conductive paste.

Example 19

The procedure of Example 11 was repeated, except that dipropylene glycol monomethyl ether (1.0 g) was replaced by benzotriazole (0.02 g) to thereby prepare a photosensitive conductive paste.

Example 20

The procedure of Example 11 was repeated, except that dipropylene glycol monomethyl ether (1.0 g) was replaced by acetic acid (1.0 g) to thereby prepare a photosensitive conductive paste.

The respective photosensitive conductive pastes of Examples 17 to 20 were evaluated for storage stability. The pastes were stored in air at 20° C. The results are shown in Table 4 together with the evaluation results of the paste of Example 11. In Table 4, rating "AA" refers to the case where gelation of the paste did not occur and application of the paste was possible. In contrast, rating "BB" refers to the case where the paste gelled and application of the paste was impossible.

TABLE 2

| Example | Additive | Immediately after preparation | After one day | After three days | After one week | After one month |
|---|---|---|---|---|---|---|
| 11 | Dipropylglycol monomethyl ether | AA | AA | AA | AA | AA |
| 17 | None | AA | BB | BB | BB | BB |
| 18 | Phosphoric acid | AA | BB | BB | BB | BB |
| 19 | Benzotriazole | AA | BB | BB | BB | BB |
| 20 | Acetic acid | AA | BB | BB | BB | BB |

As is apparent from Table 4, the paste containing no mono-ol compound and the pastes containing gelation-preventing agents other than a mono-ol compound do not gel immediately after preparation and thus the pastes exhibit initial good stability. However, the pastes containing such agents gel with passage of time.

As described above, the photosensitive conductive paste contains a mono-ol compound having a boiling point of about 178° C. or higher, and thus gelation of the paste can be suppressed sufficiently while the paste is in its original state before application and while the paste is in a film state after application and drying. Therefore, the paste has enhanced storage stability and the paste can be developed consistently by means of photolithography. As a result, a circuit substrate or a circuit element having a fine thick-film conductive pattern can be produced.

Example 21

The procedure of Example 11 was repeated, except that a glass powder was not incorporated to thereby prepare a photosensitive conductive paste. In the same manner as in Example 11, a conductive pattern of L/S=10/30 (μm) was formed on an alumina insulating substrate by use of the thus-prepared paste. The adhesion strength of the conductive pattern against the insulating substrate was measured and was 0.1 kg/2 μm×2 μm at room temperature.

Example 22

The procedure of Example 1 was repeated, except that a UV-absorbing agent was not incorporated to thereby prepare a photosensitive conductive paste. In the same manner as in Example 1, a conductive pattern of L/S=20/20 (μm) was formed on an alumina insulating substrate by use of the thus-prepared paste. As a result, space portions were also sensitized and portions insoluble in a developer were formed, and thus a pattern of L/S=20/20 (μm) as formed in Example 1 could not be formed in this instance.

Example 23

The procedure of Example 1 was repeated, except that the amount of a copper powder was changed into 9.9 g to thereby prepare a photosensitive conductive paste. In the example, the volume fraction (Vol %) of the remaining inorganic powder and conductive powder in the paste after firing was about 30%.

Example 24

The procedure of Example 23 was repeated, except that the amount of a copper powder was adjusted to obtain 29% of the volume fraction of the remaining inorganic powder and conductive powder after firing, to thereby prepare a photosensitive conductive paste.

Example 25

The procedure of Example 23 was repeated, except that the amount of a copper powder was adjusted to obtain 28% of the volume fraction of the remaining inorganic powder and conductive powder after firing, to thereby prepare a photosensitive conductive paste.

In the same manner as in Example 1, conductive patterns of L/S=10/30 (μm) were formed on alumina insulating substrates by use of the respective photosensitive conductive pastes prepared in Examples 23 to 25. In the photosensitive conductive paste prepared in Example 1, the volume fraction of the remaining inorganic powder and conductive powder after firing was 34%. The conductive patterns formed of the respective photosensitive conductive pastes of Example 1 and Examples 23 to 25 were evaluated for occurrence of pattern breakage during firing. The results are shown in Table 5. In Table 5, rating "AA" refers to the case where pattern breakage did not occur and a conductive pattern was formed desirably. In Table 5, rating "BB" refers to the case where one to five pattern breakages occurred per cm of line. In Table 5, rating "CC" refers to the case where pattern breakage occurred in more than 5 times per cm of line, and thus a pattern was difficult to form.

TABLE 5

| Example | Vol % | Rating |
|---------|-------|--------|
| 1 | 34% | AA |
| 23 | 30% | AA |
| 24 | 29% | BB |
| 25 | 28% | CC |

As is apparent from Table 5, in the cases of the photosensitive conductive pastes of Examples 1 and 23 in which the volume fraction of the remaining inorganic powder and conductive powder after firing is at least 30%, pattern breakage does not occur during firing and a conductive pattern can be formed desirably. In contrast, in the cases of the pastes of Examples 24 and 25 in which the volume fraction of the remaining inorganic powder and conductive powder after firing is less than 30%, pattern breakage occurs during firing and the shape of a formed conductive pattern tends to become poor.

Example 26

The procedure of Example 1 was repeated, except that the amount of a copper powder was adjusted to obtain 89% of the volume fraction of the remaining inorganic powder and conductive powder after firing to thereby prepare a photosensitive conductive paste.

Example 27

The procedure of Example 1 was repeated, except that the amount of a copper powder was adjusted to obtain 90% of the volume fraction of the remaining inorganic powder and conductive powder after firing to thereby prepare a photosensitive conductive paste.

Example 28

The procedure of Example 1 was repeated, except that the amount of a copper powder was adjusted to obtain 91% of the volume fraction of the remaining inorganic powder and conductive powder after firing to thereby prepare a photosensitive conductive paste.

In the same manner as in Example 1, patterns of L/S=20/20 (μm) were formed on alumina insulating substrates by use of the respective photosensitive conductive pastes prepared in Examples 26 to 28. The films formed of the respective photosensitive conductive pastes of Examples 26 to 28 were evaluated for developability. The results are shown in Table 6. In Table 6, rating "AA" refers to the case where a film did not break during development and a pattern was formed desirably. In Table 6, rating "BB" refers to the case where a film broke partially during development and a pattern failed to be formed desirably. In Table 6, rating "CC" refers to the case where a film broke entirely during development.

TABLE 6

| Example | Vol % | Rating |
|---------|-------|--------|
| 26 | 89% | AA |
| 27 | 90% | BB |
| 28 | 91% | CC |

As is apparent from Table 6, in the case of the photosensitive conductive paste of Example 26 in which the volume fraction (vol %) of the remaining inorganic powder and conductive powder after firing is less than 90%, the film does not break during development and a pattern can be formed desirably. In contrast, as in the cases of the pastes of Examples 27 and 28 in which the volume fraction of the remaining inorganic powder and conductive powder after firing is 90% or more, the film breaks during development and a pattern is difficult to form desirably.

Example 29

The procedure of Example 1 was repeated, except that a copper powder having a mean particle size of 0.2 μm was used to thereby prepare a photosensitive conductive paste.

Example 30

The procedure of Example 1 was repeated, except that a copper powder having a mean particle size of 0.1 μm was used to thereby prepare a photosensitive conductive paste.

Example 31

The procedure of Example 1 was repeated, except that a copper powder having a mean particle size of 0.07 μm was used to thereby prepare a photosensitive conductive paste.

Example 32

The procedure of Example 1 was repeated, except that a copper powder having a mean particle size of 0.04 μm was used to thereby prepare a photosensitive conductive paste.

In the same manner as in Example 1, patterns of L/S=20/20 (μm) were formed on alumina insulating substrates by use of the respective photosensitive conductive pastes prepared in Examples 29 to 32. The films formed of the respective photosensitive conductive pastes of Examples 29 to 32 were subjected to measurement of required amount of light for exposure (hereinafter referred to as "required exposure amount"). The results are shown in Table 7.

TABLE 7

| Example | Mean particle size | Required exposure amount |
|---|---|---|
| 29 | 0.2 μm | 400 mJ/cm$^2$ |
| 30 | 0.1 μm | 450 mJ/cm$^2$ |
| 31 | 0.07 μm | 2500 mJ/cm$^2$ |
| 32 | 0.04 μm | >5000 mJ/cm$^2$ |

As is apparent from Table 7, in the cases of the photosensitive conductive pastes of Examples 29 and 30 containing a copper powder having a mean particle size of 0.1 μm or more, the required exposure amount is 500 mJ/cm$^2$ or less and a pattern can be formed effectively. In contrast, in the cases of photosensitive conductive pastes of Examples 31 and 32 containing a copper powder having a mean particle size of less than 0.1 μm, the required exposure amount tends to increase.

Example 33

The procedure of Example 1 was repeated, except that a copper powder having a mean particle size of 9 μm was used to thereby prepare a photosensitive conductive paste.

Example 34

The procedure of Example 1 was repeated, except that a copper powder having a mean particle size of 10 μm was used to thereby prepare a photosensitive conductive paste.

Example 35

The procedure of Example 1 was repeated, except that a copper powder having a mean particle size of 11 μm was used to thereby prepare a photosensitive conductive paste.

In the same manner as in Example 1, patterns of L/S=20/20 (μm) were formed on alumina insulating substrates by use of the respective photosensitive conductive pastes prepared in Examples 33 to 35. The films formed of the respective photosensitive conductive pastes of Examples 33 to 35 were evaluated for developability. The results are shown in Table 8. In Table 8, rating "AA" refers to the case where connection between lines attributed to coarse particles was not formed during development and a pattern was formed desirably. In Table 8, rating "BB" refers to the case where connection between lines attributed to coarse particles was partially formed during development. In Table 8, rating "CC" refers to the case where connection between lines attributed to coarse particles was entirely formed Development.

TABLE 8

| Example | Mean particle size | Rating |
|---|---|---|
| 33 | 9 μm | AA |
| 34 | 10 μm | BB |
| 35 | 11 μm | CC |

As is apparent from Table 8, in the case of the photosensitive conductive paste of Example 33 containing a copper powder having a mean particle size of 9 μm or less, connection between lines attributed to coarse particles was not formed during development and a pattern was formed desirably. In contrast, in the cases of photosensitive conductive pastes of Examples 34 and 35 containing a copper powder having a mean particle size of 10 μm or more, connection between lines attributed to coarse particles tends to form during development.

Example 36

The procedure of Example 11 was repeated, except that a glass powder having a mean particle size of 0.2 μm was used to thereby prepare a photosensitive conductive paste.

Example 37

The procedure of Example 11 was repeated, except that a glass powder having a mean particle size of 0.1 μm was used to thereby prepare a photosensitive conductive paste.

Example 38

The procedure of Example 11 was repeated, except that a glass powder having a mean particle size of 0.07 μm was used to thereby prepare a photosensitive conductive paste.

Example 39

The procedure of Example 11 was repeated, except that a glass powder having a mean particle size of 0.04 μm was used to thereby prepare a photosensitive conductive paste.

In the same manner as in Example 11, patterns of L/S=20/20 (μm) were formed on alumina insulating substrates by use of the respective photosensitive conductive pastes prepared in Examples 36 to 39. The films formed of the respective photosensitive conductive pastes of Examples 36 to 39 were subjected to measurement of required exposure amount. The results are shown in Table 9.

TABLE 9

| Example | Mean particle size | Required exposure amount |
|---|---|---|
| 36 | 0.2 μm | 400 mJ/cm$^2$ |
| 37 | 0.1 μm | 450 mJ/cm$^2$ |
| 38 | 0.07 μm | 2500 mJ/cm$^2$ |
| 39 | 0.04 μm | >5000 mJ/cm$^2$ |

As is apparent from Table 9, in the cases of the photosensitive conductive pastes of Examples 36 and 37 containing a glass powder having a mean particle size of 0.1 μm or more, the required exposure amount is 500 mJ/cm$^2$ or less and a pattern can be formed very effectively. In contrast, in the cases of photosensitive conductive pastes of Examples 38 and 39 containing a glass powder having a mean particle size of less than 0.1 μm, the required exposure amount tends to increase.

Example 40

The procedure of Example 11 was repeated, except that a glass powder having a mean particle size of 9 μm was used to thereby prepare a photosensitive conductive paste.

Example 41

The procedure of Example 11 was repeated, except that a glass powder having a mean particle size of 10 μm was used to thereby prepare a photosensitive conductive paste.

Example 42

The procedure of Example 11 was repeated, except that a glass powder having a mean particle size of 11 μm was used to thereby prepare a photosensitive conductive paste.

In the same manner as in Example 11, patterns of L/S= 20/20 (μm) were formed on alumina insulating substrates by use of the respective photosensitive conductive pastes prepared in Examples 40 to 42. The films formed of the respective photosensitive conductive pastes of Examples 40 to 42 were evaluated for developability. The results are shown in Table 10. In Table 10, rating "AA" refers to the case where connection between lines attributed to coarse particles was not formed during development and a pattern was formed desirably. In Table 10, rating "BB" refers to the case where connection between lines attributed to coarse particles was partially formed during development. In Table 10, rating "CC" refers to the case where connection between lines attributed to coarse particles was entirely formed during development.

TABLE 10

| Example | Mean particle size | Rating |
|---------|-------------------|--------|
| 40 | 9 μm | AA |
| 41 | 10 μm | BB |
| 42 | 11 μm | CC |

As is apparent from Table 10, in the case of the photosensitive conductive paste of Example 40 containing a glass powder having a mean particle size of 9 μm or less, connection between lines attributed to coarse particles was not formed during development and a pattern was formed desirably. In contrast, in the cases of photosensitive conductive pastes of Examples 41 and 42 containing a glass powder having a mean particle size of 10 μm or more, connection between lines attributed to coarse particles tends to form during development.

The photosensitive conductive pastes prepared in Examples 23, 26, 29, 30, 33, 36, 37 and 40 were stored in air at 20° C. for evaluation of storage stability. As a result, it was found that the respective pastes did not gel immediately after preparation, nor did the respective pastes gel one day, three days, one week and one month after preparation. After each of the periods described above, the respective pastes were able to be applied to insulating substrates by use of a spin coating apparatus and a pattern could be formed by use of the respective pastes through photolithography.

Example 43

Materials having the following compositions were mixed in the following amounts, to thereby prepare a slurry.

A borosilicate glass powder: 37.3 g

An alumina powder: 24.9 g

A copolymer of methacrylic acid and methyl methacrylate in which the weight ratio of methacrylic acid to methyl methacrylate is 25/75 (weight average molecular weight= 50,000): 6.2 g Ethanol: 3.1 g Dipropylene glycol monomethyl ether: 0.5 g The thus-prepared slurry was formed into a sheet by means of a doctor blade process and the sheet was dried at 100° C. for one hour to thereby obtain a ceramic green sheet having a thickness of 30 μm.

Subsequently, in the same manner as in Example 11, a pattern of L/S=20/20 (μm) was formed on a polyethylene terephthalate (PET) film by use of the photosensitive conductive paste prepared in Example 11. The PET film was stacked on the above-obtained ceramic green sheet and the laminate was thermally pressed at 10 MPa and 60° C. for one minute. Thereafter, the PET film was peeled off and the pattern was thermally transferred onto the green sheet. The green sheet was fired in air at 900° C., to thereby obtain an alumina substrate having a conductive pattern of L/S=10/30 (μm).

Example 44

Five ceramic green sheets having patterns formed in the same manner as in Example 43 were prepared. The thus-prepared ceramic green sheets were stacked and thermally pressed at 200 MPa and 60° C. for one minute. Subsequently, the thus-formed laminate was fired in air at 900° C. to thereby obtain a multi-layer alumina substrate having conductive patterns of L/S=10/30 (μm).

Example 45

A slurry prepared in the same manner as in Example 43 was applied to a PET film having a pattern formed in the same manner as in Example 43 by means of a doctor blade process and dried at 50° C. for one hour. The resultant sheet was thermally pressed at 10 MPa and 60° C. for one minute and the PET film was peeled off. Thereafter, the sheet was fired in air at 900° C. to thereby obtain a multi-layer alumina substrate having a conductive pattern of L/S=10/30 (μm).

Example 46

Materials having the following compositions were mixed in the following amounts and the resultant mixture was kneaded by use of a three-roll mill to thereby prepare a conductive paste.

A copolymer of methacrylic acid and methyl methacrylate in which the weight ratio of methacrylic acid to methyl methacrylate is 25/75 (weight average molecular weight= 50,000): 10.0 g A borosilicate glass powder: 10.0 g A copper powder (mean particle size: 3 μm): 15.0 g Dipropylene glycol monomethyl ether: 0.5 g Subsequently, a pattern was formed on an alumina insulating substrate through screen printing by use of the thus-prepared conductive paste, and the pattern was dried at 1 00° C. for one hour to thereby form a pattern of L/S=100/100 (μm). Thereafter, the alumina insulating substrate was allowed to stand for 24 hours and fired in an $N_2$ atmosphere at 900° C., to thereby form a conductive pattern of L/S=80/120 (μm).

The conductive paste prepared in Example 46 was stored in air at 20° C. for evaluation of storage stability. As a result, it was found that the paste did not gel immediately after preparation, nor did the paste gel one day, three days, one week and one month after preparation. After each of the periods described above, a film was able to be formed on a substrate by use of the paste through screen printing.

While the invention has been particularly shown and described with reference to preferred embodiments thereof, it will be understood by those skilled in the art that the forgoing and other changes in form and details may be made therein without departing from the spirit of the invention.

What is claimed is:

1. A conductive paste having a solid portion and a solution portion and comprising an organic binder having an acidic functional group; an inorganic powder comprising at least one glass or ceramic; a conductive metallic powder; and a mono-ol having a boiling point of about 178° C. or higher; wherein at least one of said inorganic powder and conductive powder comprises a multivalent metal.

2. The conductive paste according to claim 1, wherein the conductive metallic powder comprises at least one conductive metal selected from the group consisting of gold, silver, copper, platinum, aluminum, palladium, nickel, molybdenum and tungsten.

3. The conductive paste according to claim 2, wherein the volume fraction of the inorganic powder and the volume fraction of the conductive metallic powder are each not less than about 30% and less than about 90%.

4. The conductive paste according to claim 3, further comprising a photosensitive organic component.

5. The conductive paste according to claim 4, wherein the conductive metallic powder and the inorganic powder have a mean particle size of at least about 0.1 $\mu$m but less than about 10 $\mu$m.

6. The conductive paste according to claim 5, further comprising a UV-absorbing agent.

7. The conductive paste according to claim 6, wherein the organic binder is an acrylic copolymer having a carboxylic side chain.

8. The conductive paste according to claim 7, wherein the mono-ol compound is present in at least twice the molar amount of multivalent metal ions which can be released from the said powder into the solution portion of the paste.

9. The conductive paste according to claim 8, comprising an organic solvent and wherein the amount of the mono-ol compound is about 10–92 wt. % based on the total amount of the mono-ol compound and the organic solvent.

10. The conductive paste according to claim 9, wherein the conductive metal is selected from the group consisting of gold, silver, copper, platinum, aluminum, palladium, nickel, molybdenum and tungsten and wherein the mono-ol is selected from the group consisting of dipropylene glycol monomethyl ether, 2-octyl alcohol and butyl lactate.

11. The conductive paste according to claim 1, wherein the volume fraction of the inorganic powder and the volume fraction of the conductive metallic powder are each not less than about 30% and less than about 90%.

12. The conductive paste according to claim 1, further comprising a photosensitive organic component.

13. The conductive paste according to claim 1, wherein the conductive metallic powder and the inorganic powder have a mean particle size of at least about 0.1 $\mu$m but less than about 10 $\mu$m.

14. The conductive paste according to claim 1, further comprising a UV-absorbing agent.

15. The conductive paste according to claim 1, wherein the organic binder is an acrylic copolymer having a carboxylic side chain.

16. The conductive paste according to claim 1, wherein the mono-ol compound is present in at least twice the molar amount of multivalent metal ions which can be released from said powder into the solution portion of the paste.

17. The conductive paste according to claim 1, comprising an organic solvent and wherein the amount of the mono-ol compound is about 10–92 wt. % based on the total amount of the mono-ol compound and the organic solvent.

* * * * *

UNITED STATES PATENT AND TRADEMARK OFFICE
CERTIFICATE OF CORRECTION

PATENT NO : 6,156,237
DATED : December 5, 2000
INVENTOR(S) : Kubota et al

It is certified that error appears in the above identified patent and that said Letters Patent are hereby corrected as shown below.

Column 21, line 9, for "about 178°C. or 5 higher" should read, --about 178°C. or higher--.

Signed and Sealed this

Eighth Day of May, 2001

Attest:

NICHOLAS P. GODICI

*Attesting Officer*     *Acting Director of the United States Patent and Trademark Office*